(12) United States Patent
Cheng et al.

(10) Patent No.: US 7,304,336 B2
(45) Date of Patent: Dec. 4, 2007

(54) FINFET STRUCTURE AND METHOD TO MAKE THE SAME

(75) Inventors: Zhiyuan Cheng, Cambridge, MA (US); Eugene A. Fitzgerald, Windham, NH (US); Dimitri Antoniadis, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 246 days.

(21) Appl. No.: 10/778,953

(22) Filed: Feb. 13, 2004

(65) Prior Publication Data
US 2004/0227187 A1 Nov. 18, 2004

Related U.S. Application Data

(60) Provisional application No. 60/447,191, filed on Feb. 13, 2003.

(51) Int. Cl.
*H01L 29/76* (2006.01)
*H01L 29/32* (2006.01)

(52) U.S. Cl. .................. 257/288; 257/289; 257/327; 257/E29.022; 257/E29.105

(58) Field of Classification Search ............... 257/288, 257/289, 327, E29.022, E29.105
See application file for complete search history.

(56) References Cited

U.S. PATENT DOCUMENTS

| | | | | |
|---|---|---|---|---|
| 4,233,526 A | * | 11/1980 | Kurogi et al. | ............ 365/184 |
| 5,422,317 A | * | 6/1995 | Hua et al. | ................. 438/129 |
| 5,675,164 A | | 10/1997 | Brunner et al. | |
| 5,705,321 A | | 1/1998 | Brueck et al. | |
| 6,391,782 B1 | | 5/2002 | Yu | |
| 6,413,802 B1 | | 7/2002 | Hu et al. | |
| 6,433,372 B1 | * | 8/2002 | Adler et al. | ............... 257/288 |
| 6,458,662 B1 | | 10/2002 | Yu | |
| 6,475,869 B1 | | 11/2002 | Yu | |
| 6,800,910 B2 | * | 10/2004 | Lin et al. | .................. 257/410 |
| 6,803,631 B2 | * | 10/2004 | Dakshina-Murthy et al. | ..................... 257/349 |
| 6,962,846 B2 | * | 11/2005 | Fishburn et al. | ........... 438/243 |
| 2002/0043690 A1 | | 4/2002 | Doyle et al. | |
| 2002/0187356 A1 | | 12/2002 | Weeks, Jr. et al. | |
| 2003/0057486 A1 | | 3/2003 | Gambino et al. | |

FOREIGN PATENT DOCUMENTS

| EP | 1202335 | 5/2002 |
|---|---|---|
| WO | 2004/032246 | 4/2004 |
| WO | 2004/038807 | 5/2004 |

OTHER PUBLICATIONS

Pierret, Modular Series on Solid State Devices—Field Effect Devices, 1983, Addison-Wesley, vol. IV, cover figure with pp. 81-85.*

(Continued)

*Primary Examiner*—Evan Pert
(74) *Attorney, Agent, or Firm*—Gauthier & Connors LLP (57) ABSTRACT

A multiple-gate FET structure includes a semiconductor substrate. A gate region is formed on the semiconductor substrate. The gate region comprises a gate portion and a channel portion. The gate portion has at least two opposite vertical surfaces adjacent to the channel portion. A source region abuts the gate region at one end, and a drain diffusion region abuts the gate region at the other end.

16 Claims, 13 Drawing Sheets

OTHER PUBLICATIONS

Yu et al., "Robust High-Quality HfN-HfO2 Gate Stack for Advanced MOS Device Applications", IEEE Electron Device Letters, vol. 25, No. 2, Feb. 2004, pp. 70-72.*

Gendt et al., "Implementation of high-k gate dielectrics—a status update", IWGI 2003, Tokyo, pp. 10-14.*

Muller and Kamins, Device Electronics for Integrated Circuits, 2$^{nd}$ Edition, John Wiley & Sons, 1986, p. 417.*

"Tri-gate fully depleted CMOS Trasistors: Fabrication, Design, and Layout," Doyle et al. *2003 Symposium on VLSI Technology Digest of Technical Papers.* Logic Department, Intel Corporation.

"Scaling the Si MOSFET: From Bulk to SOI Bulk," Yan et al. *IEEE Transactions on Electron Devices.* Jul. 1992. vol. 39, No. 7.

"Sub 50-nm FinFET: PMOS," Huang et al. *1999 IEEE.* Dept. of Engineering and Computer Sciences, Univ. of CA at Berkley.

"High Performance 45nm CMOS Technology with 20 nm Multi-Gate Devices," Krivokapic et al. *Extended Abstracts of the 2003 International Conference on Solid State Devices and Materials,* Tokyo 2003.

"A Spacer Patterning Technology for Nanoscale CMOS," Choi et al. *IEEE Transactions on Electron Devices,* Mar. 2002. vol. 49, No. 3.

"Nanoscale CMOS Spacer FinFET for the Terabit Era," Choi et al. *IEEE Electron Device Letters.* Jan. 2002. vol. 23, No. 1.

"Introduction to Silicon On Insulator Materials and Devices," Cristoloveanu. *Microelectronic Engineering.* vol. 39, pp. 145-154, (1997).

"Crystalline Quailty of Silicon Layer Formed by Fipos Technology," Imai et al. *Journal of Crystal Growth.* vol. 63, pp. 547-553, (1983).

"FinFET-A Self-Aligned Double-Gate MOSFET Scalable to 20 nm," Hisamoto et al. *IEEE Transactions on Electron Devices.* vol. 47, No. 12, (Dec. 2000).

"A New SOI Device—Delta—Structure and Characteristics." Takeda et al. *The Transactions of the Institute of Electronics, Information and Comm. Engineers.* No. 2, (Feb. 1991).

* cited by examiner

FIG. 8B (top view)

FIG. 8C (X-X view)

FIG. 8D (Y-Y view)

FIG. 8E (Y-Y view)

FIG. 8F (Y-Y view)

FIG. 9A (top view)

FIG. 9B (X-X view)

FIG. 9C (Y-Y view)

FINFET STRUCTURE AND METHOD TO MAKE THE SAME

PRIORITY INFORMATION

This application claims priority from provisional application Ser. No. 60/447,191 filed Feb. 13, 2003, which is incorporated herein by reference in its entirety.

BACKGROUND OF THE INVENTION

The invention relates to the field of multiple-gate field effect transistor (FET) and method to fabricate the same, and in particular to fabricating strained-Si multiple-gate FET structures.

One of the primary challenges of very large scale integration (VLSI) has been the integration of an ever-increasing number of MOSFET devices within a single chip. This was achieved mainly in the prior art by scaling down the MOSFET device feature size without excessive short-channel effects. When the device becomes smaller and smaller, short-channel effects, which are caused by the two-dimensional electrostatic charge sharing between the gate and the source/drain diffusion regions, become a serious issue.

To scale down a MOSFET feature size without excessive short-channel effects, multiple-gate MOSFET structures have been developed. Yan, et al., "Scaling the Si MOSFET: From bulk to SOI to bulk", IEEE Trans. Elect. Dev., Vol. 39, p. 1704, July 1992, have shown that to reduce short-channel effects for 0.05 μm MOSFETs, it is important to have a backside-conducting layer present in the structure that screens the drain field away from the channel. The Yan, et al. results show that double-gated MOSFETs, or MOSFETs with a top gate and a backside ground plane, or in general multiple-gate device, are more immune to short-channel effects and hence can be scaled to shorter dimensions than conventional single-gated MOSFETs.

In all the multiple-gate MOSFETs, there are at least two gates which are opposite to each other, one on each side of the channel. The two gates are electrically connected so that they serve to modulate the channel. Short-channel effects are greatly suppressed in such a structure because the two gates very effectively terminate the drain field line preventing the drain potential from being felt at the source end of the channel. Consequently, the two-dimensional electrostatic charge sharing between the gate and the source/drain diffusion regions in a multiple-gate MOSFET is much smaller than that of a conventional single-gated structure of the same channel length.

Moreover, multiple-gate MOSFET can provide significant performance advantages over the single gate devices. Various multiple-gate processes have been proposed. One promising approach is the FinFET technology, where silicon "fins" are defined on an insulator substrate, and two gates are made on the both sidewall of the fin. High performance FinFET CMOS has been designed using the state of art industry settings (See Y-K Choi, et al "Nanoscale CMOS spacer FinFET for the Terabit era," *IEEE, Electron Device Letters*, Vol. 23, No. 1, pp 23-27, 2002).

Another multiple-gate technology is formed using the Tri-Gate CMOS technology, which utilizes the additional top surface besides the two sidewalls (See B. Doyle, et al. "Tri-Gate fully-depleted CMOS transistors: fabrication, design, and layout," *IEEE VLSI Symposium*, 2003). Other multiple-gate technology includes Ω-gate technology, gate-all-around technology, etc.

To implement the multiple-gate technology, conventional thin film SOI wafers are used. Since the multiple-gate devices have very small channel dimension, typically less than 100 nm, thus the non-uniformity of the Si film thickness across a SOI wafer will affect the device performance significantly. Thus, the multiple-gate technology requires very good film thickness uniformity. However, the conventional methods for SOI substrate production typically involve costly processes such as high dose ion implantation or wafer bonding. In addition, the SOI substrate produced by conventional methods has limitations in film thickness range and thickness uniformity. There is also no well-established method to produce strained-Si multiple-gate device in the prior art. A strained-Si multiple-gate device is able to combine the benefits of multiple-gate technology and high electron and hole mobility. Strained-Si is shown to enhance electron and hole mobility significantly.

SUMMARY OF THE INVENTION

According to one aspect of the invention, there is provided a multiple-gate FET structure. The multiple-gate FET structure includes a semiconductor substrate. A gate region is formed on the semiconductor substrate. The gate region comprises a gate portion and a channel portion. The gate portion has at least two opposite vertical surfaces adjacent to the channel portion. A source region abuts the gate region at one end, and a drain diffusion region abuts the gate region at the other end.

According to another aspect of the invention, there is provided a multiple-gate FET structure. The multiple-gate FET structure includes a semiconductor substrate. A gate region is formed on the semiconductor substrate. The gate region comprises a gate portion and a channel portion. The gate portion has at two opposite vertical surfaces and one horizontal top surface adjacent to the channel portion. A source region abuts the gate region at one end, and a drain diffusion region abuts the gate region at the other end.

According to another aspect of the invention, there is provided a method of forming a multiple-gate FET structure. The method includes providing a semiconductor substrate, and forming a gate region on the semiconductor substrate. The gate region comprises a gate portion and a channel portion. The gate portion has at least two opposite vertical surfaces adjacent to the channel portion. Furthermore, the method includes forming a source region that abuts the gate region at one end and forming a drain diffusion region abuts the gate region at the other end.

According to another aspect of the invention, there is provided a method of forming a multiple-gate FET structure. The method includes providing a semiconductor substrate, and forming a gate region on the semiconductor substrate. The gate region comprises a gate portion and a channel portion. The gate portion has at two opposite vertical surfaces and one horizontal top surface adjacent to the channel portion. Furthermore, the method includes forming a source region that abuts the gate region at one end and forming a drain diffusion region abuts the gate region at the other end.

According to another aspect of the invention, there is provided a digitalized semiconductor structure that includes a semiconductor substrate. A plurality of fin-shaped strips are formed on the semiconductor substrate. The fin-shaped strips have identical widths and identical heights and are distributed evenly throughout the entire structure, with a feature pitch between one another.

According to another aspect of the invention, there is provided a method of forming a digitalized semiconductor structure that includes a semiconductor substrate. The method includes forming a plurality of fin-shaped strips on the semiconductor substrate. The fin-shaped strips have identical widths and identical heights and are distributed evenly throughout the entire structure, with a feature pitch between one another.

According to another aspect of the invention, there is provided a method of forming a digitalized semiconductor structure that includes a semiconductor substrate. The method includes forming a first semiconductor layer on the substrate. A second semiconductor layer is formed on the first layer, and the second semiconductor layer is different from the first semiconductor layer. Also, the method includes patterning the second semiconductor layer into a plurality of fin-shaped strips. The fin-shaped strips have identical heights, identical widths, and being distributed evenly throughout the entire substrate, with a feature pitch d between one another. Furthermore, the method includes converting the first semiconductor layer into a buried oxide layer.

According to another aspect of the invention, there is provided a method of forming a digitalized semiconductor structure that includes a semiconductor substrate. The method includes forming a first semiconductor layer on the substrate. The first semiconductor layer is converted into a first porous semiconductor layer. The method includes forming a second semiconductor layer on the first porous semiconductor layer. The second semiconductor layer is patterned into a plurality of fin-shaped strips. The fin-shaped strips having identical heights, identical widths, and being distributed evenly throughout the entire substrate, with a feature pitch d between one another. Furthermore, the method includes converting the first porous semiconductor layer into a buried oxide layer.

DETAILED DESCRIPTION OF THE INVENTION

The invention provides a digitalized semiconductor-on-insulator substrate. The advantage of such a digitalized semiconductor-on-insulator substrate is two-fold: (1) low wafer cost due to the starting substrate for the digitalized semiconductor-on-insulator substrate fabrication is bulk substrate instead of insulating substrate, and (2) uniform fin-shaped strips across the entire wafer, as it is defined by, for example, an epitaxial step and an etch process on a bulk Si wafer which forms the "fins", instead of by the SOI film. The digitalized semiconductor-on-insulator substrate can be used as a general substrate for any multiple-gate CMOS IC design. It is analogous to conventional silicon substrates, which can be used for any CMOS IC application.

Figure 1A:
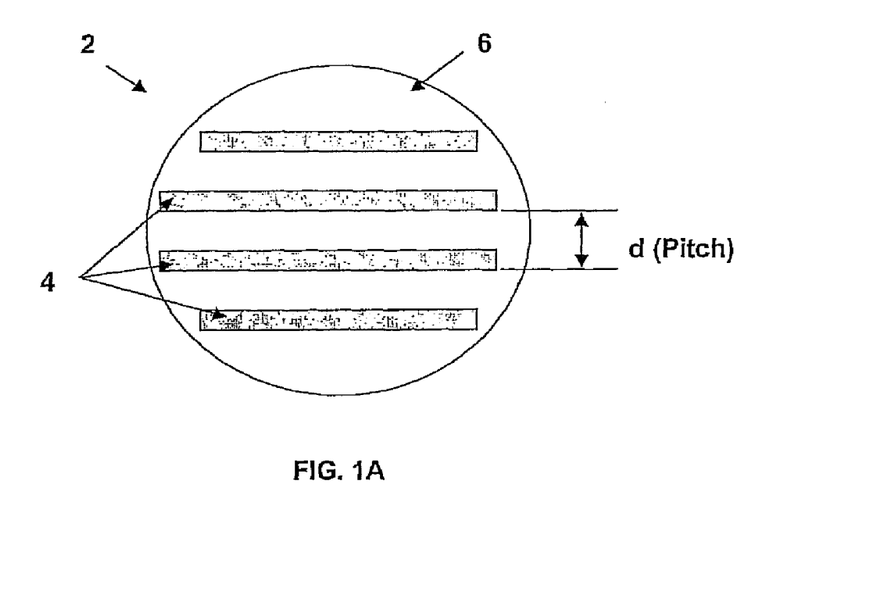
FIGS. 1A-1B are schematic diagrams illustrating the concept of the digitalized semiconductor-on-insulator substrate.
Figure 1B:
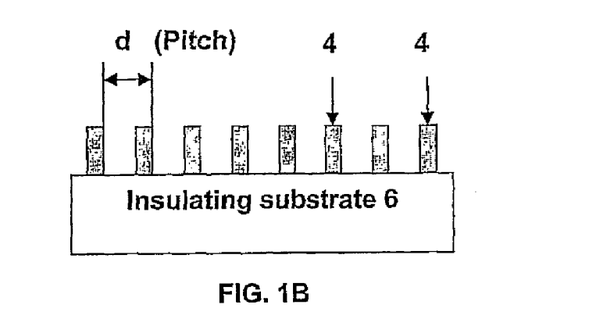

FIGS. 1A-1B show the concept of a digitalized semiconductor-on-insulator substrate 2. In particular, FIG. 1A illustrates a top view of the substrate 2, and FIG. 1B is a cross-sectional view of the substrate 2. In the digitalized semiconductor-on-insulator substrate 2, isolated semiconductor structures 4 (or lines) are provided on the insulating substrate 6. The lines 4 are distributed evenly throughout the wafer, as shown in FIG. 1A and FIG. 1B. A typical value of pitch d ranges from 10 nm to 500 nm. In other embodiments, the semiconductor lines 4 are not limited to Si, they may comprise relaxed-SiGe, relaxed-Ge, strained-Si, strained-SiGe, strained-Ge, SiC, GaN, GaAs or other III-V materials.

In alternative embodiments, the insulating substrate 6 can include any one of the following: a SOI material, a SSOI (strained-Si on insulator) material, a SGOI (SiGe on insulator) material, a strained-SGOI (strained-SiGe on insulator) material, a GOI (Ge on insulator) material, a strained-GOI (strained-Ge on insulator) material.

Figure 2A:
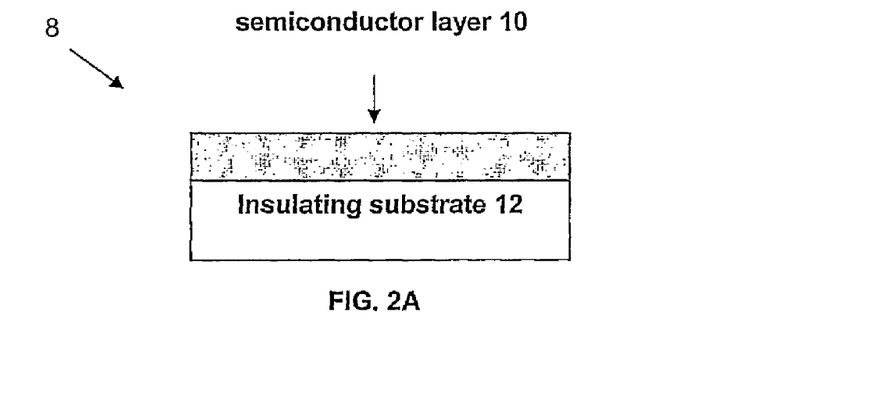
FIGS. 2A-2C are schematic diagrams illustrating a conventional SOI substrate and the IC fabrication process on the conventional SOI substrate.
Figure 2B:
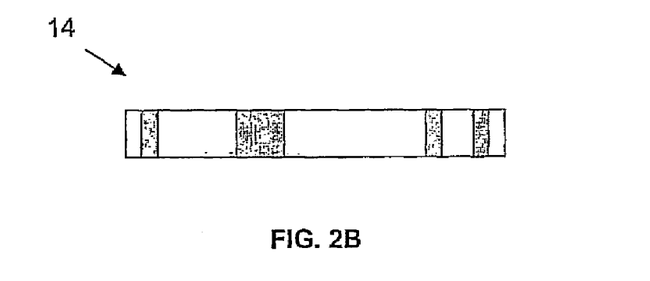
Figure 2C:
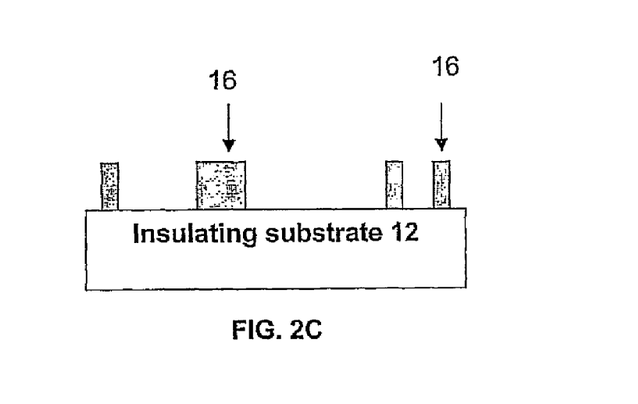

In comparison, FIGS. 2A-2C show a SOI substrate 8 and the IC fabrication process on the SOI substrate 8 in the prior art. FIG. 2A shows the SOI substrate 8 having a continuous semiconductor layer 10 on an insulating substrate 12. In the conventional SOI IC fabrication process, customized IC layout design 14 is performed, as shown in FIG. 2B. The SOI substrate 8 is then patterned into desired semiconductor islands 16 according to the IC layout design 14, as shown in FIG. 2C. Those islands 16 may not necessarily have even dimensions and are typically not evenly distributed across the wafer. On those islands 16, conventional SOI devices are fabricated.

Figure 3A:
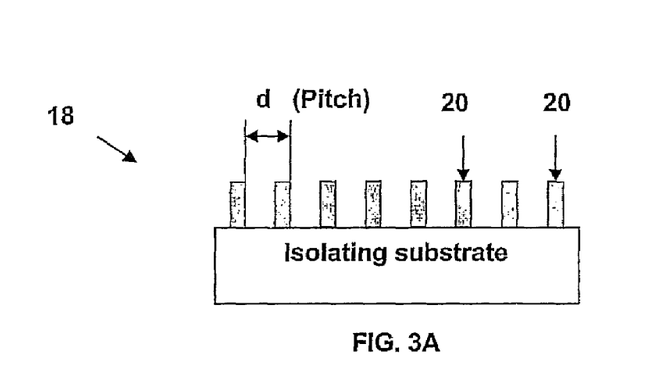
FIGS. 3A-3C are schematic diagrams demonstrating the IC fabrication process on a digitalized semiconductor-on-insulator substrate.
Figure 3B:
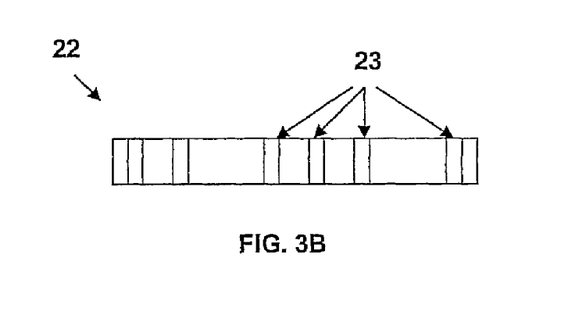
Figure 3C:
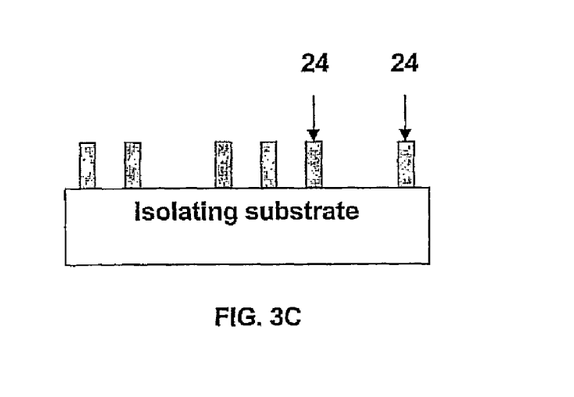

In contrast, FIGS. 3A-3C show the multiple-gate IC fabrication process on a digitalized semiconductor-on-insulator substrate 18, in accordance with the invention. In the digitalized semiconductor-on-insulator substrate 18, the semiconductor lines 20 are defined before the start of the IC layout design and semiconductor device fabrication. The substrate 18 has a feature line pitch value d, as shown in FIG. 3A. Then the customized multiple-gate (FinFET or Tri-gate) IC layout design 22 is performed, as shown in FIG. 3B. During the layout design, every semiconductor island 23 (corresponding to the Fins) in the design is required to have a digitalized value and digitalized location so that it can fit into the digitalized semiconductor-on-insulator substrate 18 where the lines 20 have a pitch of d. This can be easily done since the pitch d is so small (less than a few hundred nm), and any island 23 in the IC layout design can fit into the digitalized semiconductor-on-insulator substrate 18 by simply shifting the location by a distance less than the pitch size. The next step is to pattern the digitalized semiconductor-on-insulator substrate 18 into a desired structure according to the particular IC layout design 22, by simply removing part of the lines 20, as shown in FIG. 3C.

The benefit of the digitalized semiconductor-on-insulator substrate is that the digitalized semiconductor-on-insulator substrate can be produced in large volume without knowing the individual multiple-gate IC layout design. Therefore, the cost will be low due to the large volume. It also makes the IC device fabrication simple, since the Fin formation is one critical step. It is a general substrate for multiple-gate FET IC application. The requirement is that all the semiconductor islands on the IC layout have the same width and same height. This requirement is naturally met in FinFET or Tri-gate FET technology, where all the fins, i.e., lines, have the same dimension.

Figure 4A:
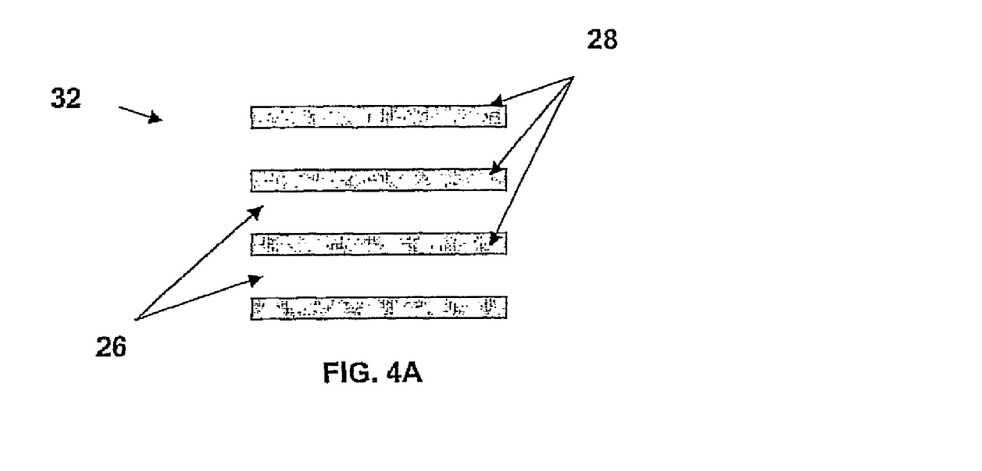
FIGS. 4A-4B are schematic diagrams illustrating a technique used to make a source or drain of a FinFET structure using a digitalized semiconductor-on-insulator substrate.
Figure 4B:
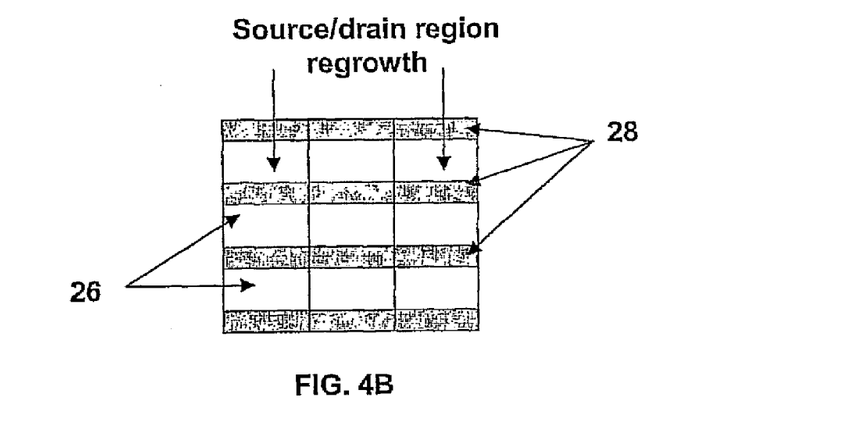

Although all the fins of a FinFET or a Tri-gate FET have the same dimensions and are separated from one another with an identical pitch, their source or drain regions typically have larger sizes than the channel fins, and all the fins join together in the source and drain region. FIGS. 4A-4B show the technique used to make larger the size of the source or drain out of the digitalized semiconductor-on-insulator substrate. FIGS. 4A-4B illustrate the formation of the source/drain regions 26 of FinFET devices. The semiconductor lines (fins) 28 on a digitalized semiconductor-on-insulator substrate are patterned into desired structure 32 according to the IC layout design, as shown in FIG. 4A. Then a semiconductor regrowth step is performed on the source/drain region 26 to join various lines 28 together, as shown in FIG. 4B. This can be achieved during the conventional raised source/drain epi regrowth step. The raised source/drain epi regrowth step is a typically performed on thin SOI devices in order to increase the thickness of source/drain areas to facilitate source/drain contact. The lines 28 between the source/drain region 26 are fins for the FinFET device.

Note the semiconductor structures discussed herein can be comprised of various materials, such as Si, Ge, SiGe, SiC, GaAs, or other III-V materials, strained or unstrained etc. The typical SOI and FinFET device are made of Si material.

FIGS. 5A-5C and FIGS. 6A-6B illustrate techniques to produce digitalized semiconductor-on-insulator substrates in accordance with the invention. This inventive technique provides an approach to produce digitalized semiconductor-on-insulator substrates with uniform layers and structures with desired thicknesses. Moreover, the inventive technique produces digitalized semiconductor-on-insulator substrates without costly processes, such as high dose ion implantation or wafer bonding as in the conventional SOI fabrication.

Figure 5A:
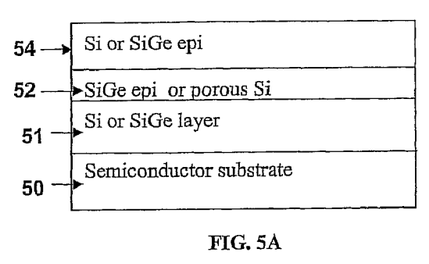
FIGS. 5A-5C are schematic diagrams illustrating a technique to produce digitalized semiconductor-on-insulator substrates in accordance with the invention.
Figure 5B:
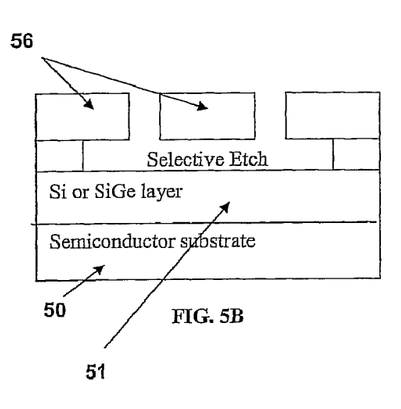
Figure 5C:
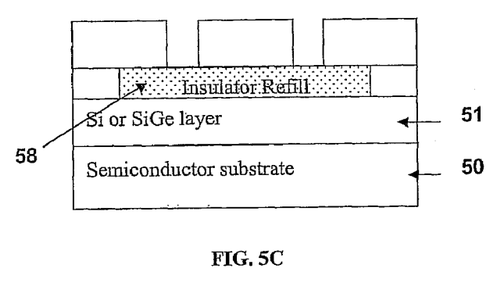

FIG. 5A shows a SiGe or Si layer 51 formed on a single crystal semiconductor substrate 50, which can be a Si substrate or a SiGe virtual substrate, for example. A top layer 52 is formed on the layer 51, and can be either a SiGe or Si layer. The top layer 52 can also be convened into a porous layer. A single crystal device layer 54 of either SiGe or Si is then formed on the top layer 50, for example, by using standard epi techniques. The device layer 54 is then patterned into digitalized semiconductor lines 56. Selective etching is then performed as shown in FIG. 5B. Since the SiGe layer or porous layer 52 etches faster, the layer 52 is etched away while the digitalized semiconductor lines 56 remain. An insulator material is refilled in the space area to form a buried insulator layer 58, resulting in a digitalized SOI structure, as shown in FIG. 5C. The presence of the insulating layer in the structure gives various benefits for the device fabricated on this structure, such as reduced parasitic capacitance, which results in faster circuit speed or lower power consumption, etc.

Figure 6A:
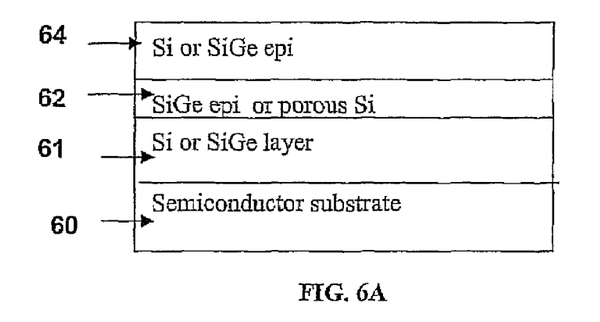
FIGS. 6A-6B are schematic diagrams illustrating another technique to produce digitalized semiconductor-on-insulator substrates in accordance with the invention.
Figure 6B:
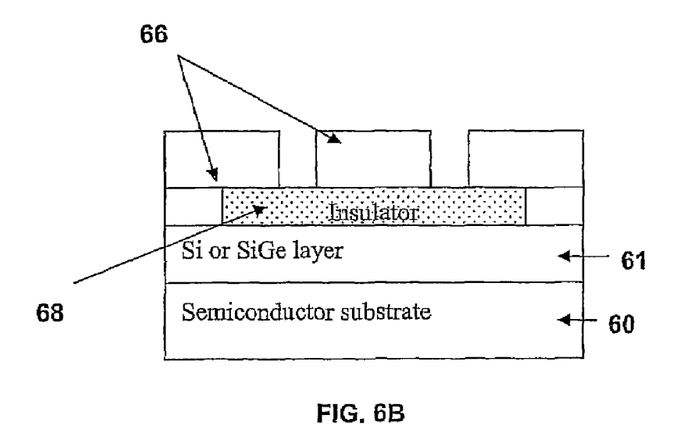

FIGS. 6A-6B show another approach to the technique discussed with reference to FIGS. 5A-5C. In particular, FIG. 6A shows a SiGe or Si layer 61 formed on a single crystal semiconductor substrate 60. A top layer 62 is formed on the layer 61, and can be either a SiGe or Si layer. The top layer 62 can also be converted into porous material in one alternative embodiment. Then a single crystal device layer 64 of either SiGe or Si is formed on the top layer 62, for example, by using standard epi techniques, as shown in FIG. 6A. The device layer 64 is then patterned into digitalized semiconductor lines 66. Selective oxidation or nitridation is then performed to convert the layer 62 into insulator 68. Since the SiGe layer or porous layer 62 oxidizes faster and since the dimension is very small, the layer 62 converts to insulator quickly while the digitalized semiconductor lines 66 are still there, as shown in FIG. 6B.

In yet another aspect of the invention, a technique is provided to produce a digitalized strained-Si-on-insulator substrate to be used with strained-Si FinFET applications, and a process to produce strained-Si FinFET devices.

Figures 7A, 7B:
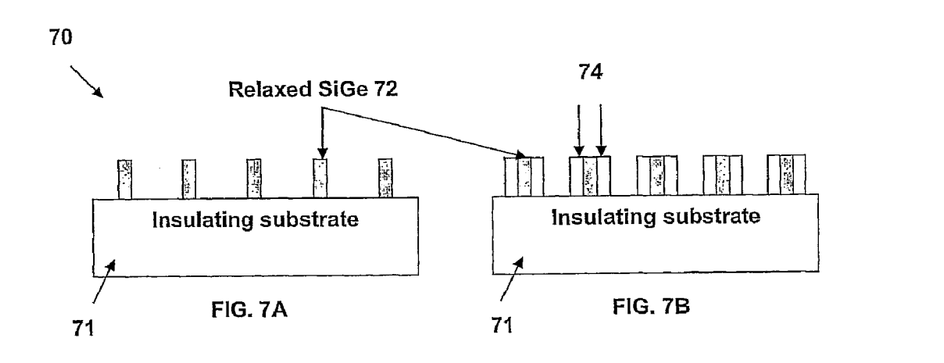
FIGS. 7A-7E are schematic diagrams illustrating the formation of various digitalized strained-Si fin structures.

FIGS. 7A-7E illustrate the formation of a digitalized strained-Si Fin structures. In particular, FIG. 7A shows a digitalized relaxed-SiGe-on-insulator substrate 70 having SiGe relaxed digitized structures or lines 72 and insulating substrate 71. Epi strained-Si layers 74 are grown on the sidewalls of the SiGe lines 72 on the substrate 70, as shown in FIG. 7B. Strained-Si FinFET devices can be then made on this substrate 70. Note the epi strained-Si layers 74 can also be grown before the step of forming the insulator layer, as discussed in FIGS. 5A-5C and FIGS. 6A-6C, but after patterning the SiGe layer into digitalized lines.

Figure 7C:
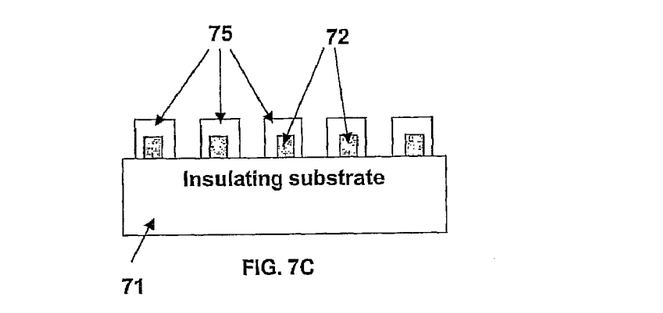

FIG. 7C illustrate another embodiment of a digitalized strained-Si fin structure, where epi strained-Si layers 75 are not only grown on the two sidewalls of the SiGe lines 72 on the substrate 70, but also on the top surface of SiGe lines 72.

Figure 7D:
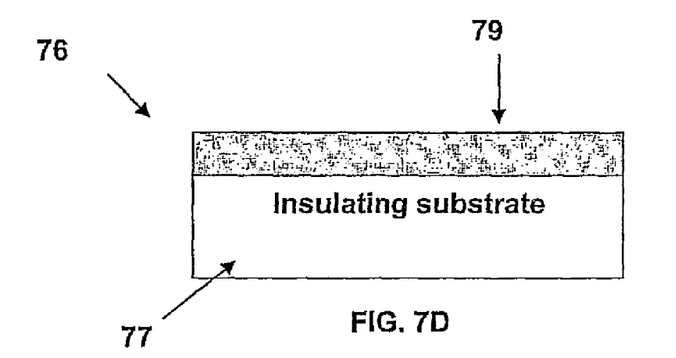
Figure 7E:
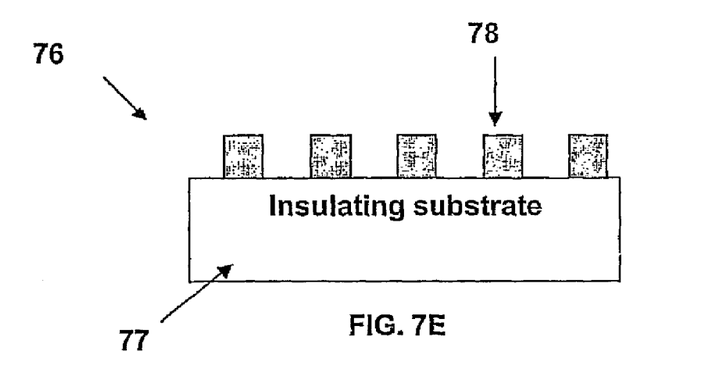

FIGS. 7D-7E illustrate yet another embodiment of a digitalized strained-Si fin structure 76. It starts with a uniform strained-Si layer 79 on the substrate 70, as shown in FIG. 7D. The layer 79 is then patterned into digitalized lines 78, as shown in FIG. 7E. The embodiments shown in FIGS. 7A-7E of strained-Si substrates have different directions of strain. In the above structure 76, the lines 78 can be other materials, such Ge, SiGe, SiC, strained or unstrained.

Figure 8A:
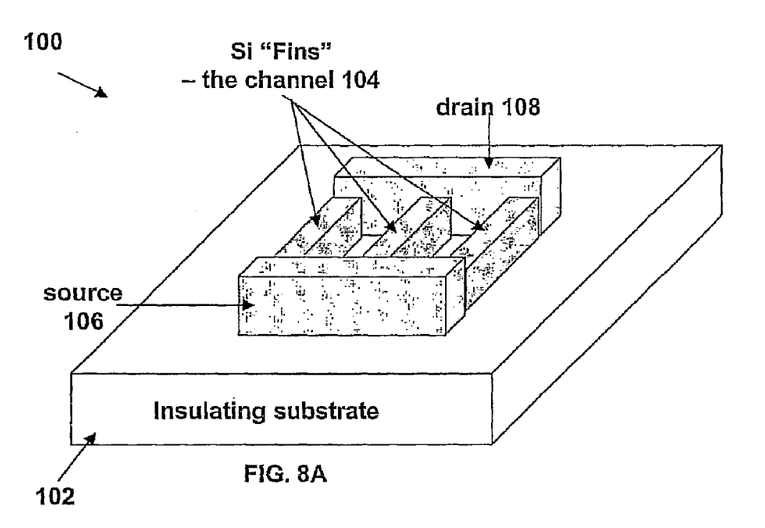
FIGS. 8A-8F are schematic diagrams illustrating a conventional Si multiple-gate FET transistor.
Figure 8B:
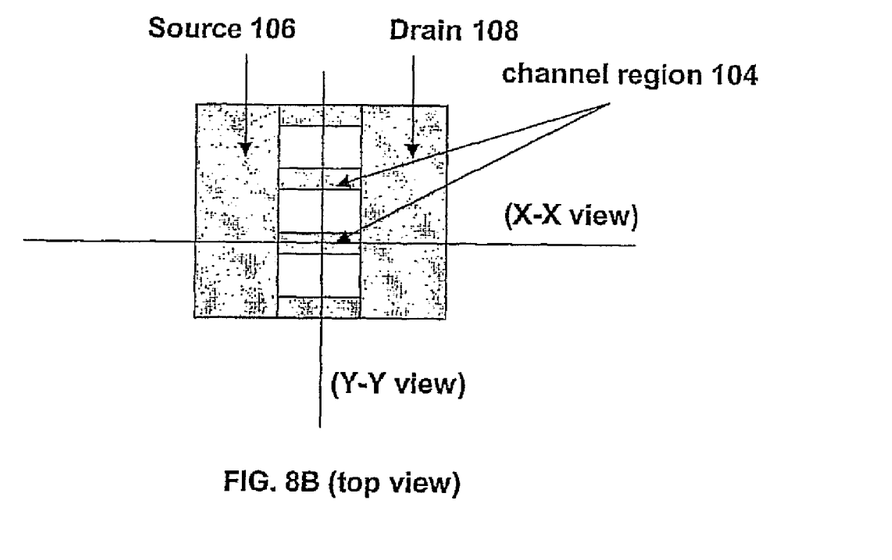
Figure 8C:
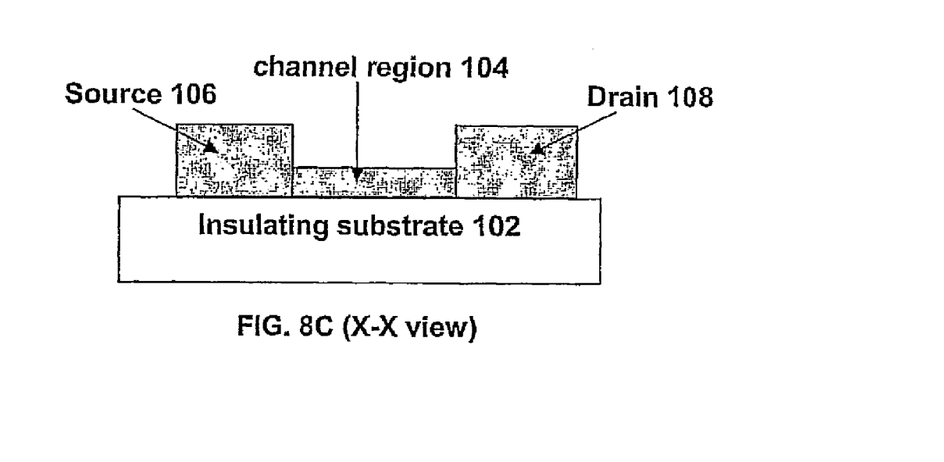
Figure 8D:
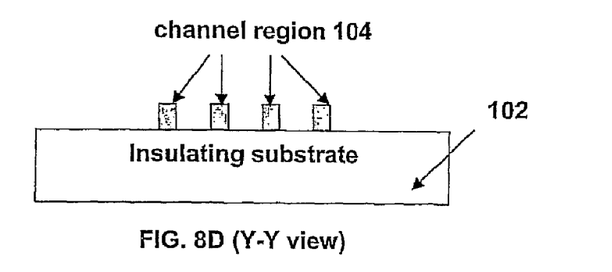

FIGS. 8A show a Si multiple-gate FET transistor 100, fabricated on a SOI substrate 102. FIG. 8B shows the top view of a conventional Si FinFET or a Si Ttr-gate FET 100. FIG. 8C and FIG. 8D show the cross-section views of the same device 100 in two different directions. The Si FinFET or Tri-gate device 100 has several separate Si channel regions 104 (fin-shaped) in between a source region 106 and drain region 108. The fin-shaped channel 104 typically has small heights. In order to have a good contact on source/drain regions, 106, 108 a typical raised source/drain epi regrowth step is used to increase the heights of the source/drain regions 106, 108. The FinFET and Tri-Gate FET devices in the prior art differ in the number of gates.

Figure 8E:
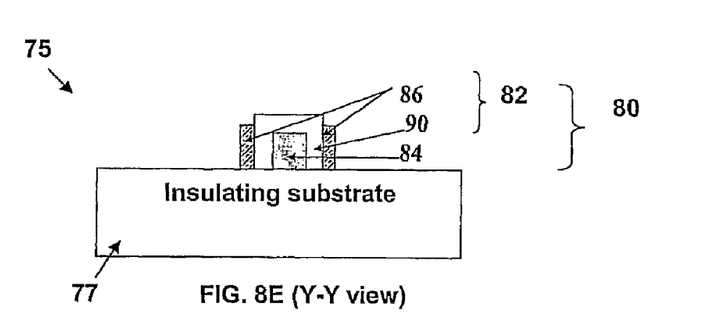
Figure 8F:
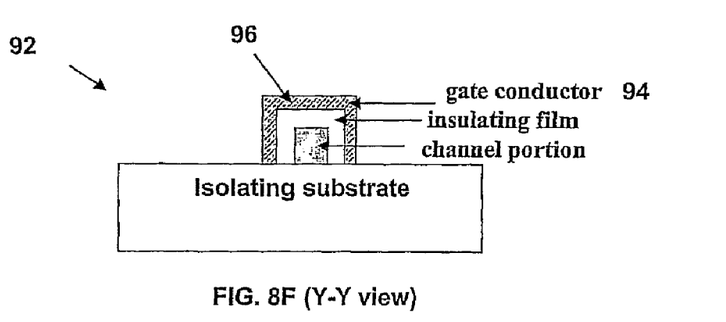

FIGS. 8E-8F illustrate the detailed structures of the FinFET and Tri-gate device, in particular the MOSFET device. FIG. 8E illustrates a gate region 80 on the substrate 77. The gate region 80 includes two portions: a gate portion 82 and a channel portion 84, which includes one of the line structures 104 from FIG. 8A-8D. The gate portion 82 includes two opposite gate conductors 86 adjacent to a channel portion 84 and insulating film 90. The gate conductors 86 can be semiconductor or metal materials. The insulating film 90 can be a silicon oxide, nitride or high-k dielectric material, such as $HfO_2$, $ZrO_2$, Hfn. The source/drain diffusion regions abut the gate region 80, and have junctions connecting to the two ends of the channel portion 84. FIG. 8F shows the gate structure 92 of a Tri-gate FET. It is similar to the structure 75 shown in FIG. 8E, except the gate conductor 94 of the structure 92 shown in FIG. 8F includes a horizontal top portion 96.

In order to make the multiple-gate devices on a SOI wafer having controllable performance, the uniformity of the height of all channel strips across the entire wafer, which originates from the uniformity of the starting SOI wafer, is very crucial. Multiple-gate device also require to start with ultra-thin SOI wafers. However, the conventional methods for SOI substrate production have limitations in film thickness and thickness uniformity. The conventional methods also typically involve costly processes such as high dose ion implantation or wafer bonding.

Figure 9A:
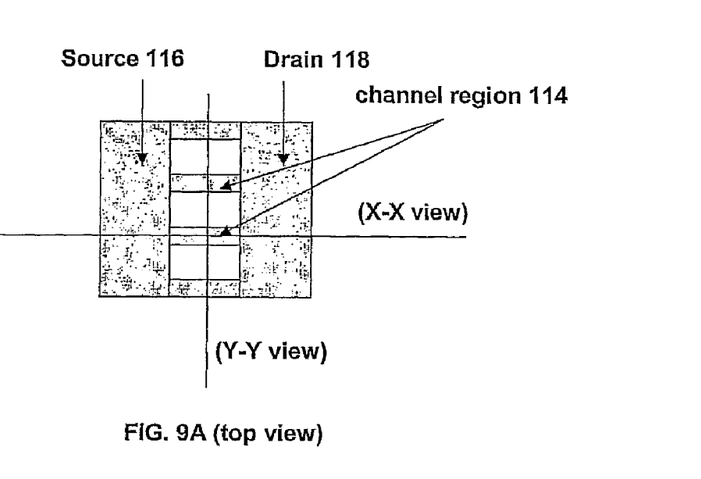
FIGS. 9A-9C are schematic diagrams illustrating a multiple-gate FET device fabricated directly on a bulk semiconductor substrate.
Figure 9B:
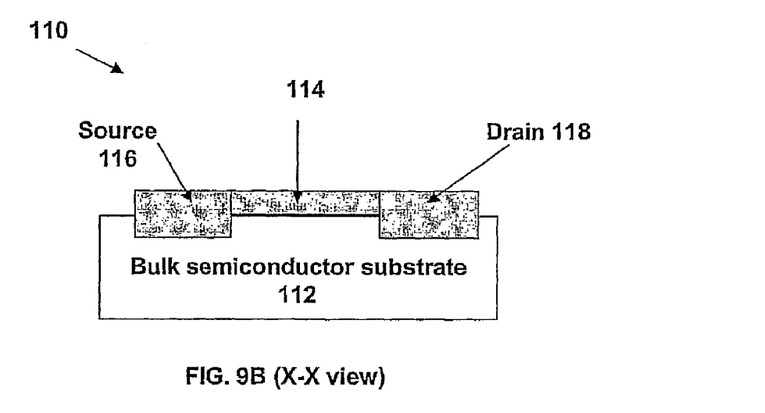
Figure 9C:
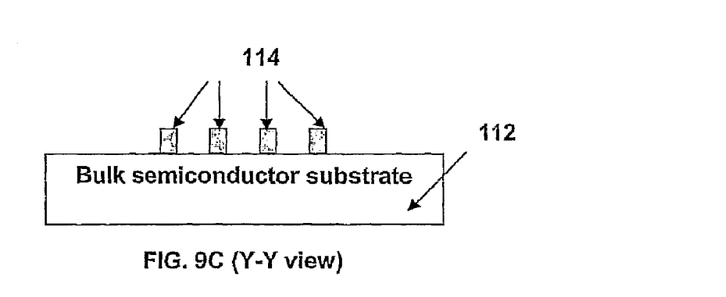

The invention provides a multiple-gate FET device structure which does not require SOI substrates, and provides much improved fin film thickness uniformity. FIG. 9A shows the top view of the multiple-gate FET device. FIGS. 9B and 9C show the cross-section view in Y-Y and X-X directions respectively. This inventive multiple-gate FET device 110 is fabricated directly on a bulk Si substrate 112 having a source 116 and drain 118. Note the substrate 112 can also be a SiGe substrate or the like in other embodiments. Thanks to the multiple-gate structure, the fin-shaped channel regions 114 maintain the same device performance as those made on an insulating substrate 102. In one embodiment, the substrate 112 beneath the fin-shaped channel region 114 is doped such that it never turns on, therefore minimizes the influence of the bulk semiconductor substrate on the device performance.

The difference between this structure and the conventional multiple-gate FET in FIG. 8 is the substrate, i.e. bulk Si substrate in FIG. 9 versus insulating substrate in FIG. 8. The advantage of such a multiple-gate FET 110 on bulk substrate 112 is three-fold: (1) low wafer cost due to the use of bulk substrate 112 instead of an insulating substrate, (2) uniform fin-shaped strip height across the entire wafer, as it is defined by etch process which forms the fins, and (3) no floating-body effect since it is not a SOI structure.

Figure 10A:
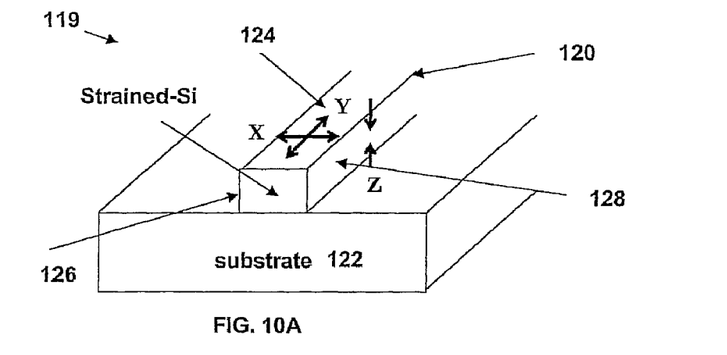
FIGS. 10A-10C are schematic diagrams illustrating three different fin-shaped channel region structures used to form strained-material multiple-gate devices.
Figure 10B:
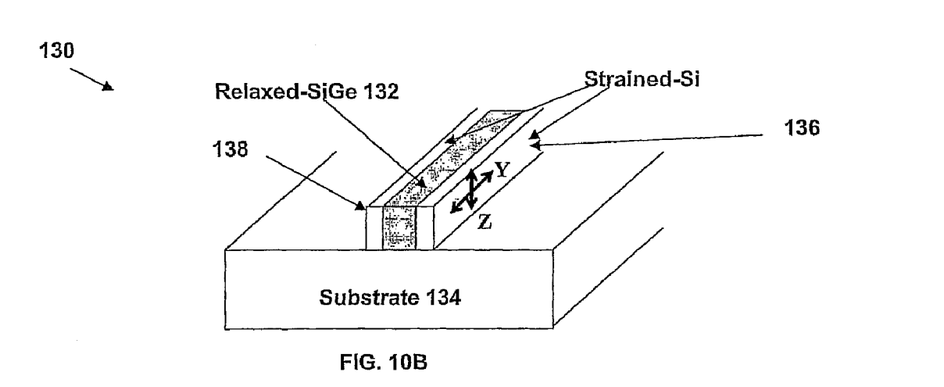
Figure 10C:
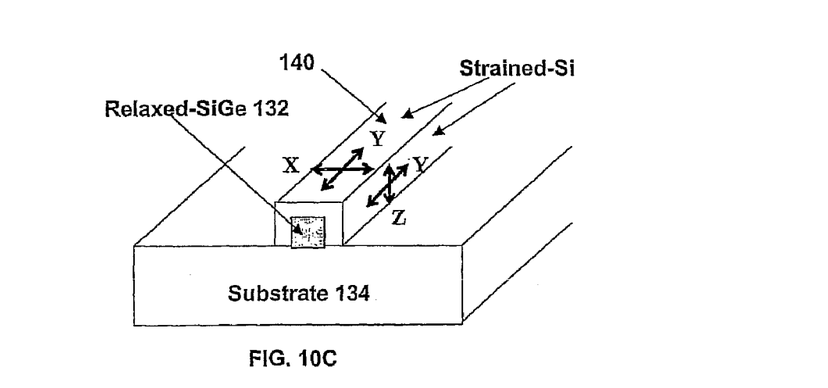

The invention also provides a high mobility multiple-gate FET device structure. By using strained-semiconductor materials or high Ge content materials such as strained-Si, strained-SiGe, or strained-Ge, the device's electron and hole mobility are improved dramatically. However, the use of strained-material is not straightforward. FIGS. 10A-10C show three different fin-shaped channel region structures used to form strained-material multiple-gate devices, using tensile strained-Si as an example. In FIG. 10A, the fin strip 120 is formed directly from a strained-Si on insulator (SSOI) substrate 122. The fin strip 120 has 3 surfaces 124, 126, 128. As indicated in the FIG. 10A, the top horizontal surface 124 exhibit a biaxial tensile strain in both X and Y directions. The other two vertical surfaces, 126, 128, however, exhibit uniaxial tensile strain, i.e. tensile strain in Y direction only. In the Z direction, it is compressive strain. As understood in the prior art, biaxial tensile strained-Si shows better mobility enhancement than uniaxial strained-Si.

FIG. 10B shows another structure 130. In this structure 130, a relaxed SiGe strip 132 is formed first on a substrate 134. Then a strained-Si regrowth can be performed to form strained-Si films on the two vertical surfaces 136, 138 of the relaxed-SiGe strips 132. As a result, both strained-Si films on the two vertical surfaces 136, 138 are in biaxial tensile strain, in both Y and Z directions. This is a multiple-gate device with the gate portion structure same as the one shown in FIG. 8E (FinFET). If strained-Si is also deposited on the top horizontal surface 140 in FIG. 10B, it is also biaxial strained, in both X and Y direction, as shown in FIG. 10C. This is a multiple-gate device with the gate portion structure same as the one shown in FIG. 8F (Tri-gate FET). In other embodiments, other strained-materials, such as strained-SiGe or strained-Ge, can be used. In these structures, the substrate 122 and 134 can be either an insulating substrate, like the one in FIG. 8, or a bulk semiconductor substrate, like the one in FIG. 9.

Although the present invention has been shown and described with respect to several preferred embodiments thereof, various changes, omissions and additions to the form and detail thereof, may be made therein, without departing from the spirit and scope of the invention.

What is claimed is:

1. A multiple-gate field effect transistor (FET) structure comprising:
   a single crystal bulk substrate,
   a gate region formed on said single crystal bulk substrate comprising a plurality of fin-shaped digitized structures, each of said fin-shaped digitized structures comprising a gate portion, an insulator layer, and a channel portion, said gate portion having at least two opposite vertical surfaces adjacent to the channel portion and the insulator layer, said insulator layer surrounds said channel portion and provides separation between said gate portion and said channel portion;
   a source region abutting said gate region at one end;
   a drain diffusion region abutting said gate region at the other end;
   wherein said multiple-gate field effect transistor (FET) structure is formed directly on said single crystal bulk substrate.

2. The multiple-gate FET structure of claim 1, wherein said channel portion comprises either a Si channel, a strained-Si channel, a relaxed-SiGe channel, a strained-SiGe channel, a relaxed-Ge channel, a strained-Ge channel, a SiC channel.

3. The multiple-gate FET structure of claim 1, wherein said channel portion comprises a center relaxed-semiconductor material region and an outer strained-semiconductor material region that covers at least two opposite vertical surfaces of the center relaxed-semiconductor material region.

4. The multiple-gate FET structure of claim 3, wherein said center relaxed-semiconductor material is either a relaxed-Si, a relaxed-SiGe, or a relaxed-SiC, and said outer strained-semiconductor material comprises either strained-Si, strained-SiGe, strained-SiC or strained-Ge material.

5. The multiple-gate FET structure of claim 1, wherein said single crystal bulk substrate comprises a bulk Si substrate, a bulk Ge substrate, a bulk SiGe virtual substrate, or a bulk GaAs substrate.

6. The multiple-gate FET structure of claim 1, wherein said gate portion comprises a poly Si material, or a metal-gate material such as TiN, Mo, Ti.

7. The multiple-gate FET structure of claim 1, wherein said insulating film comprises a high-k dielectric material.

8. The multiple-gate FET structure of claim 7, wherein said high-k dielectric material comprises a material selected from the group consisting of $HfO_2$, $ZrO_2$, HfN.

9. A multiple-gate field effect transistor (FET) structure comprising:
   a single crystal bulk substrate,
   a gate region formed on said single crystal bulk substrate, comprising a plurality of fin-shaped digitized structures, each of said fin-shaped digitized structures comprising a gate portion, an insulator layer, and a channel portion, said gate portion having at least two opposite vertical surface and one horizontal top surface adjacent to the channel portion and the insulator layer, said insulator layer surrounds said channel portion and provides separation between said gate portion and said channel portion; and a source region abutting said gate region at one end;

a drain diffusion region abutting said gate region at the other end;

wherein said multiple-gate field effect transistor (FET) structure is formed directly on said single crystal bulk substrate.

10. The multiple-gate FET structure of claim 9, wherein said channel portion comprises either a Si channel, a strained-Si channel, a relaxed-SiGe channel, a strained-SiGe channel, a relaxed-Ge channel, a strained-Ge channel, or a SiC channel.

11. The multiple-gate FET structure of claim 9, wherein said channel portion comprises a center relaxed-semiconductor material region and an outer strained-semiconductor material region that covers at least two opposite vertical surfaces of the center relaxed-semiconductor material region.

12. The multiple-gate FET structure of claim 11, wherein said center relaxed-semiconductor material is either a relaxed-Si, a relaxed-SiGe, or a relaxed-SiC, and said outer strained-semiconductor material comprises either strained-Si, strained-SiGe, strained-SiC or strained-Ge material.

13. The multiple-gate FET structure of claim 9, wherein said single crystal bulk substrate comprises a bulk semiconductor substrate, such as a bulk Si substrate, a bulk Ge substrate, a bulk SiGe virtual substrate, or a bulk GaAs substrate.

14. The multiple-gate FET structure of claim 9, wherein said gate portion comprises a poly Si material a metal-gate material such as TiN, Mo, Ti.

15. The multiple-gate FET structure of claim 9, wherein said insulating film comprises a high-k dielectric material.

16. The multiple-gate FET structure of claim 15, wherein said high-k dielectric material comprises a material selected from the group consisting of $HfO_2$, $ZrO_2$, Hfn.

* * * * *